Nov. 8, 1960 WEN YUAN PAN 2,959,743
HIGH FREQUENCY TUNER HAVING TEMPERATURE COMPENSATING MEANS
Filed July 27, 1956 3 Sheets-Sheet 1

INVENTOR.
Wen Yuan Pan
BY H. L. Newton
ATTORNEY.

Nov. 8, 1960 WEN YUAN PAN 2,959,743

HIGH FREQUENCY TUNER HAVING TEMPERATURE COMPENSATING MEANS

Filed July 27, 1956 3 Sheets-Sheet 2

INVENTOR.
Wen Yuan Pan
BY H. L. Newton
ATTORNEY.

HIGH FREQUENCY TUNER HAVING TEMPERATURE COMPENSATING MEANS

Filed July 27, 1956 3 Sheets-Sheet 3

INVENTOR.
Wen Yuan Pan
BY H. W. Muston
ATTORNEY.

2,959,743
Patented Nov. 8, 1960

2,959,743

HIGH FREQUENCY TUNER HAVING TEMPERATURE COMPENSATING MEANS

Wen Yuan Pan, Haddon Heights, N.J., assignor to Radio Corporation of America, a corporation of Delaware Filed July 27, 1956, Ser. No. 600,481

8 Claims. (Cl. 331—66)

This invention relates to high frequency tuners and more particularly relates to frequency compensation or stabilization systems for ultra high frequency tuning circuits of the type including tunable resonant transmission lines.

Ultra high frequency tuners of the type including tunable resonant transmission lines as the frequency-selective elements thereof are subject to substantial deviations in frequency from the desired frequency of operation with changes in temperature such as, for example, during the initial warm-up period of the tuner. For most applications it is desirable to maintain the frequency deviation of the tuned circuits within a relatively narrow frequency range and to reduce the "equivalent tuner warm-up time," which may be defined as the time elapsing before the deviation in the tuning of any of the resonant line sections from the desired frequency is within acceptable limits.

The problem is of particular importance in receivers, such as color television receivers, wherein for best operation the received carrier frequency signal must be heterodyned to a corresponding intermediate frequency (I.F.) signal of a frequency which is on a particular portion of the I.F. selectivity curve. In other words, if the local oscillator frequency drifts or deviates from the desired value, the point of operation on the I.F. selectivity curve will vary. Deviations from the desired operating frequency may be tolerated within limits. However, in the usual form of the ultra high frequency tuner, the oscillator frequency may not be stabilized within acceptable limits for as long a period as an hour, and the resulting displacement of the point of operation on the I.F. selectivity curve produces commercially unacceptable reception.

It is an object of the present invention to provide an improved high frequency tuner of the type including a resonant transmission line as a tuning element thereof, in which the drift or deviation of the resonance frequency of the circuit from the desired frequency of operation is quickly stabilized within acceptable limits.

It is another object of this invention to provide an improved frequency compensation system for tunable resonant transmission lines of the type which are subject to deviations in frequency from a desired operating frequency with temperature changes.

It is a further object of this invention to provide an improved ultra high frequency resonant line type tuner for signal receiver local oscillators which is stabilized to compensate for deviations in the operating frequency due to component temperature changes and the like.

In accordance with the present invention, a high frequency tuner including a tunable resonant transmission line, is provided with a first temperature-sensitive, that is, temperature-variable, compensating reactance element or device, such as a temperature-sensitive capacitor, connected thereacross at a point along the line which constitutes a voltage null point at a first frequency which may for example be near the low frequency end of the tuning range. Since the voltage null point constitutes an actual or effective short-circuit across the line, the relative effectiveness of the first temperature sensitive element is substantially zero or minimum at the first frequency and is of increasing effectiveness in compensating for frequency variations over a range of frequencies above or below the first frequency.

A second temperature sensitive reactance element which may also be a temperature sensitive capacitor is connected across the resonant line at a voltage null point for a second frequency which may for example be near the high end of the tuning range. Similarly the relative effectiveness of the second frequency sensitive element is minimum at the second frequency and increases over a range of frequencies above or below the second frequency. The temperature sensitivity of the first and second elements and the reactance value of these elements are chosen so that the composite effectiveness provides temperature compensation for the tuner over a range of frequencies including that between the first and second frequencies. This compensation system provides what may be called two-point compensation in that the compensation is approximate except at two frequencies in the frequency band to be tuned, at which frequencies the compensation is exact. By proper selection of the exactly compensated frequencies, the frequency deviation error at other frequencies can be minimized.

If a more exact compensation or stabilization over the frequency range of the tunable resonant line is desired, a third temperature sensitive reactance element or device, of opposite temperature sensitivity to that of the first and second elements, is connected across the resonant line at the voltage null point of a third frequency which may be, for example, that frequency at which the composite effectiveness of the first and second elements is minimum. A compensation system using three elements provides what may be called three-point compensation and permits the deviation from the desired frequency to be held within a relatively narrow range.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 6:
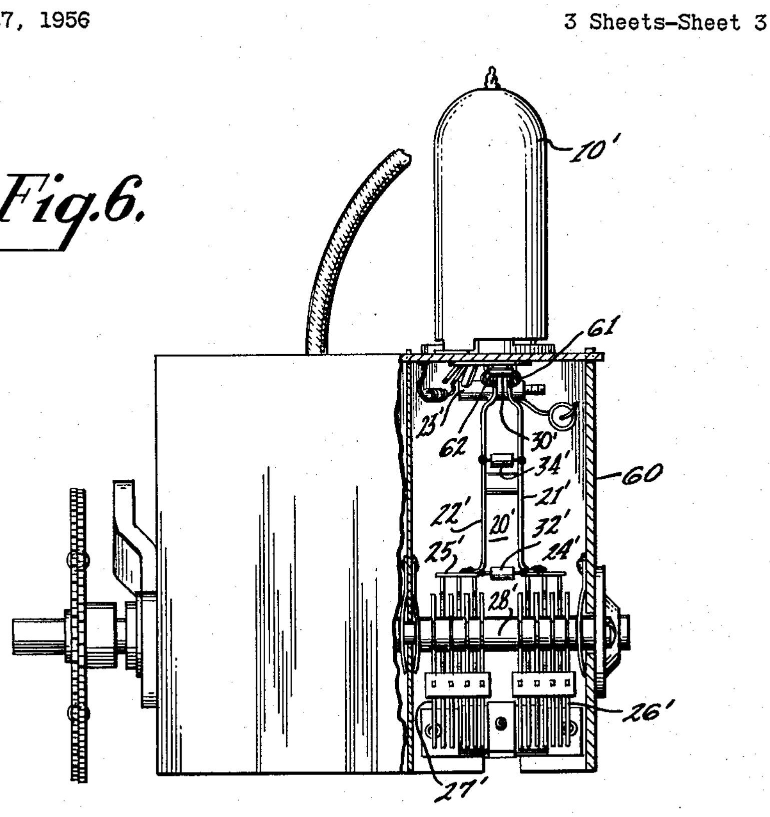
Figure 7:
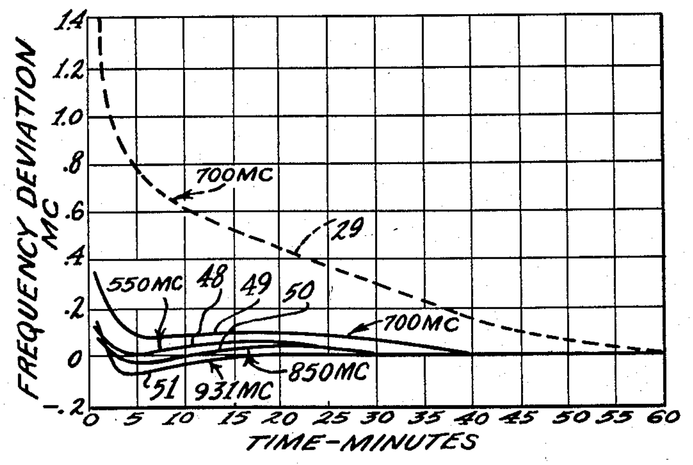

Figure 6 is a side view of an ultra high frequency television tuner partly broken away to show the tunable resonant transmission line of the oscillator section thereof which includes the frequency compensating system of the invention; and Figure 7 is a graph showing warm-up time vs. frequency deviation characteristic curves of an ultra high frequency television tuner as compared to the same ultra high frequency tuner embodying a frequency compensation system in accordance with the invention.

Figure 1:
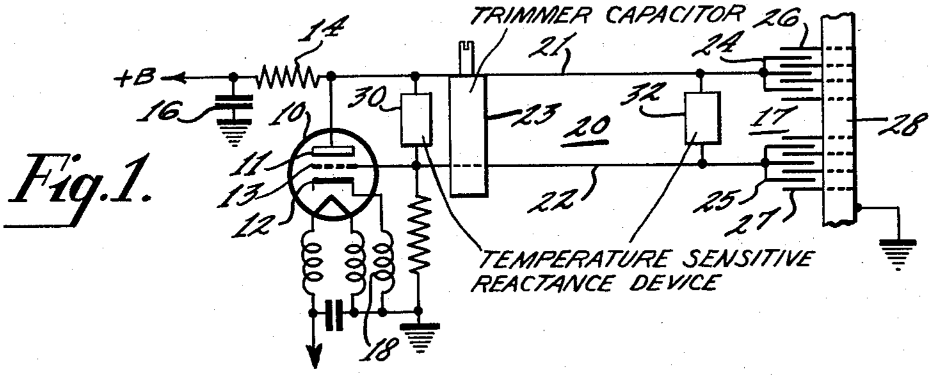
Figure 1 is a schematic circuit diagram of an ultra high frequency oscillator including a tunable resonant transmission line incorporating a two-point frequency compensation system in accordance with the invention.

Referring now to the drawings wherein like reference numerals are used to designate similar components throughout and particularly to Figure 1, an ultra high frequency (UHF) oscillator stage which may form a portion of a UHF tuner includes a tube 10 such as a 6AF4 type triode having an anode 11, cathode 12 and control electrode 13. The anode 11 of the triode 10 is connected through a resistor 14 to a suitable source of operating potential +B which is bypassed to ground by a filter capacitor 16. The cathode of the oscillator triode 10 is returned to ground through a radio frequency choke coil 18.

The oscillator stage includes a tunable resonant transmission line 20 having a pair of parallel conductors 21 and 22 which are connected respectively with the anode 11 and control grid 13 of the triode 10. The transmission line is a variable-capacity end-loaded line having two sets of stator plates 24 and 25 of a variable capacitor 17 connected to the free ends of the conductors 21 and 22 respectively. Two sets of rotor plates 26 and 27 which are mounted on a common conductive shaft 28 are positioned to mesh with stator plates 24 and 25 to vary the capacity between the ends of the conductors and thereby tune the resonant line. A variable trimmer capacitor 23 is connected across the conductors 21 and 22 adjacent the tube 10 to provide a tuning or tracking adjustment near the high frequency end of the tuning range.

The oscillator may comprise, for example, a portion of a UHF television tuner which is operable to tune in any one of the 70 UHF channels in the assigned frequency band of 470 to 890 megacycles (mc.). Since most television receivers have a 40 mc. intermediate frequency amplifier, the oscillator frequency must differ from the desired signal frequency to be received by a frequency equal to the I.F. of the receiver. In the usual case, the oscillator is tuned to a frequency above the signal frequency in which case the oscillator should be tunable over a range of frequencies extending from 517 mc. to 931 mc. The tube 10 together with the other components connected with and comprising the resonant line in most commercial tuners exhibit a poistive temperature coefficient which produces a deviation from a desired operating frequency of 700 mc. as shown by the dashed curve 29 of Figure 7. However, the compensation system of the invention is equally applicable if the tuner exhibits a negative temperature sensitivity characteristic. It can be seen from Figure 7 that the oscillator frequency is not stabilized at zero deviation even after a warm-up time of one hour. These deviations are caused primarily by: the variation in anode 11 to control grid 13 interelectrode capacitance as the tube 10 heats up; the expansion of the conductors 21 and 22 and the tuning capacitor at the end of the line with temperature changes which takes place over a relatively long time; and variations with temperature change of such things as the oscillator injection circuit. The frequency deviation due to the tube 10 is a relatively short time component and accounts for the relatively steep portions near the abscissa of the graph shown in Figure 7. The changes in the length of the conductors 21 and 22 and in the variable tuning capacitor produces a relatively long time deviation and accounts for the long slope of the curves in Figure 7 after the first 3 or 4 minutes of operation.

In accordance with the invention, a first temperature-sensitive, that is, temperature variable, reactance device or element 30, such as a capacitor, is connected between the conductors 21 and 22 adjacent the socket pins of the oscillator triode tube 10. A second temperature-sensitive reactance device or element, such as a capacitor 32, is connected between the conductors 21 and 22 immediately adjacent the stator plates 24 and 25. By way of example, the reactance devices 30 and 32 may comprise temperature-sensitive capacitors of a type, for example, having a titanium oxide dielectric. The reactance devices 30 and 32 exhibit a negative temperature coefficient to compensate for the positive temperature coefficient of the tuner.

Negative or positive temperature coefficient as used herein to describe a temperature sensitive reactance device means that the capacitance or inductance of the reactance device as the case may be increases as the temperature increases or decreases as the temperature decreases. In most tuners the composite effect of the temperature sensitive components comprising the tuner is positive, that is the effective inductance or capacitance connected with the line increases. This explains the slope of the curve 29 shown in Figure 7, wherein the frequency decreases as the tuner warms up. It is to be understood, however, that the principles underlying the invention are equally applicable to tuners exhibiting a negative temperature coefficient in which case the temperature coefficient of the compensating capacitors 30 and 32 is positive.

The oscillator frequency voltage along the resonant line 20 is minimum at the socket pins of the oscillator tube 10, near the high frequency end of the tuning range of the resonant transmission line 20, at which frequency the conductors 21 and 22 appear to be short-circuited at the socket pins. The temperature sensitive capacitor 30 which is connected across the socket pins of the oscillator tube 10 appears to be shorted out near the high frequency end of the tuning range, and therefore has little effect on the oscillator frequency at the high frequency end of the range, but affects lower frequencies.

Likewise, an oscillator frequency voltage null point appears across the transmission line 20 at the junction of the conductors 21 and 22 with the stator plates 24 and 25 near the low frequency end of the tuning range. Thus the temperature sensitive capacitor 32 does not substantially affect the oscillator frequency at the low frequency end of the tuning range since the capacitor 32 is effectively shorted out. However, the capacitor 32 does affect higher oscillator frequencies.

For illustrative purposes, the two null points at the extreme ends of the resonant line 20 are assumed to be 1000 mc. and 500 mc. at the oscillator socket pins and stator junction respectively. Then the relative effectiveness $P_1$ of the compensating capacitor 30 at the socket pins on the oscillator frequency is determined by the following simple expression:

$$P_1 = 1 - [\sin \theta_1]$$

where $$\theta_1 = \tfrac{1}{2}\pi f_{(\text{mc.})/1000}$$

Similarly, the relative effectiveness $P_2$ of the compensating capacitor 32 at the stator junction on the oscillator frequency becomes:

$$P_2 = 1 - [\sin \theta_2]$$

where $$\theta_2 = \tfrac{1}{2}\pi f_{(\text{mc.})/500}$$

Figure 2:
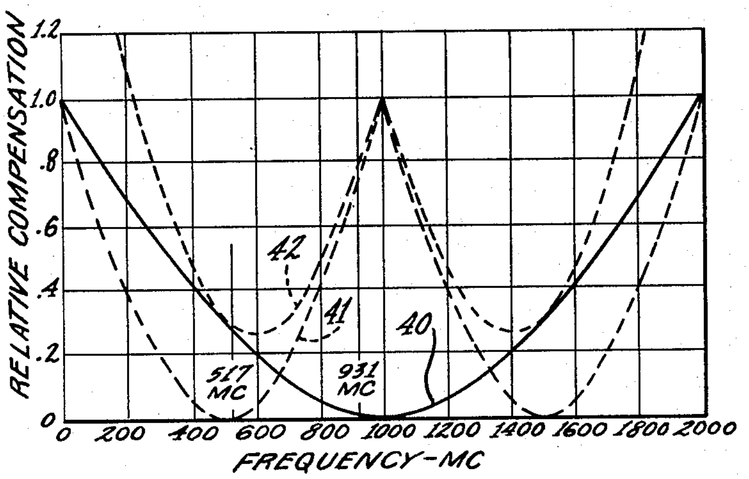
Figure 2 is a graph showing the curves indicating the relative effectiveness of one-point and two-point frequency compensation of the oscillator shown in Figure 1.

The solid curve 40 of Figure 2 shows the $P_1$ function, while the dashed curve 41 shows the $P_2$ function. The $P_1$ function which is produced by the capacitor 30 has zero relative compensation at 1000 mc. but provides increasing compensation effectiveness toward the low end of the frequency range. Likewise, the compensation which is produced by the capacitor 32, the $P_2$ function, is zero at 500 mc. but is of increasing effectiveness toward the high frequency end of the band. It can be seen by observing these curves 40 and 41 that a single temperature sensitive capacitor may provide good compensation for a single frequency or a narrow frequency band. The position of such a compensating capacitor along the resonant transmission line is dictated by the frequency at which the compensation is intended.

The composite relative compensation provided by the two compensating capacitors 30 and 32 which are connected in the desired positions with respect to the resonant line is the sum of the $P_1$ and $P_2$ functions which is shown by the dotted curve 42 in Figure 2. The $P_1+P_2$ function shown in Figure 3 indicates that the temperature sensitive capacitors are least effective at a frequency of about 700 mc. and increases to a maximum effectiveness toward the high frequency end of the band to be tuned. The $P_1+P_2$ function assumes that the maximum effectiveness of $P_1$ is the same as that of $P_2$. It is to be understood however that the maximum effectiveness of either $P_1$ or $P_2$ can be varied independently by using a higher temperature-sensitivity capacitor or a higher value of temperature sensitive capacitance.

Figure 4:
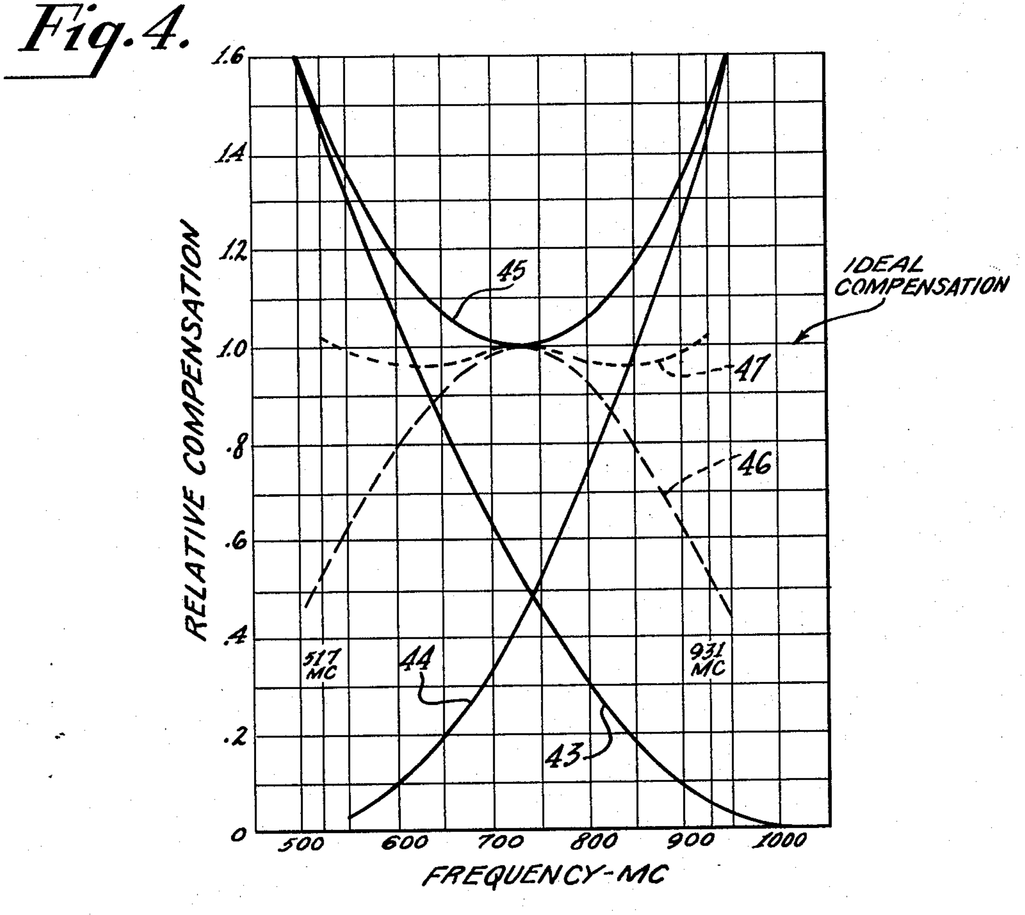
Figure 4 is a graph showing curves indicating the relative effectiveness of the three-point frequency compensation in the oscillator circuit of Figure 3.
Figure 5:
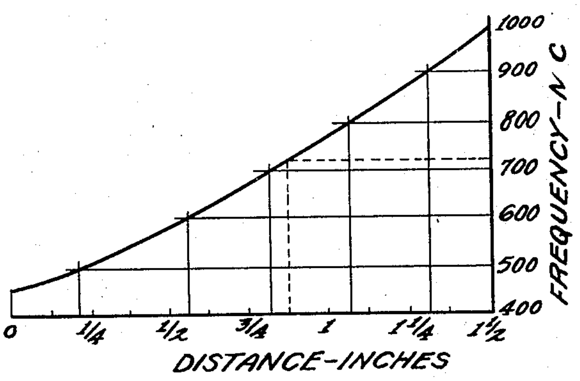
Figure 5 is a graph showing a curve indicating the positions along the tunable resonant lines of the oscillators shown in Figures 1 and 3 at which various frequencies of signals to be tuned provide voltage null points.

By adjusting the relative maximum effectiveness of the capacitors 30 and 32, a more uniform relative compensation across the frequency range may be achieved. For example, Figure 4 shows the $K_1P_1$ and $K_2P_2$ curves 43 and 44 respectively which are derived from the $P_1$ and $P_2$ curves of Figure 2 where $K_1$ equals 1.85 and $K_2$ equals 5.5. As indicated in Figure 5, the ideal compensation is shown to be at a relative compensation of 1.0. Therefore, the $K_1P_1+K_2P_2$ curve 45 indicates good compensation at 725 mc. but over compensation at all other frequencies particularly at 517 and 931 mc. Conversely, if the values of $K_1$ and $K_2$ are so selected that the oscillator is properly compensated at 517 mc. and 931 mc., the oscillator would be undercompensated at all other frequencies particularly at 725 mc.

Figure 3:
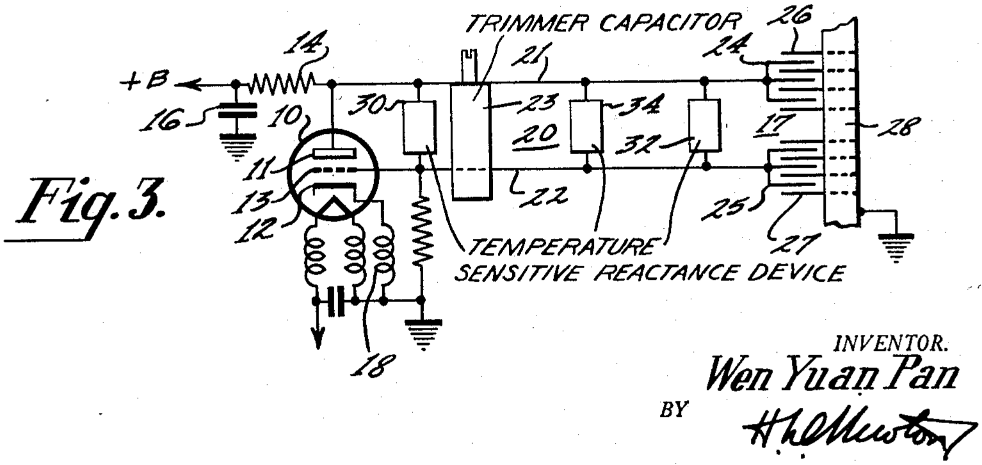
Figure 3 is a schematic circuit diagram of an ultra high frequency oscillator including a tunable resonant transmission line showing a three-point frequency compensating system embodying the invention.

The schematic circuit diagram shown in Figure 3 is similar to that as shown in Figure 1 with the exception that a third compensating capacitor 34 is connected between the conductors 21 and 22 at a point intermediate the ends of the conductors to further improve the relative compensation over the entire frequency range.

The capacitors 30 and 32 shown in the schematic circuit diagram of Figure 3 are selected to provide the compensation shown by the curve 45 of Figure 4. For example, these capacitors may comprise a 1N1500 and a .5N750 type capacitors which exhibit negative temperature coefficients. As pointed out above, the oscillator circuit has ideal compensation at all other frequencies. Therefore, the capacitor 34 should be positioned along the resonant line 20 at a point where the effect thereof is minimum at 725 mc. In other words, the capacitor 34 should be connected between the conductors 21 and 22 at the oscillator frequency voltage null point for 725 mc. Referring to Figure 5 which is a graph showing the oscillator frequency voltage null points along the resonant transmission line 20, the null point on the line for 725 mc. is ⅞" along the conductors 21 and 22 from the stator end of the line.

Since the capacitors 30 and 32 have a negative temperature characteristic, and the oscillator circuit is overcompensated at all frequencies other than 725 mc., the capacitor 34 should exhibit a positive temperature coefficient. By way of example, the capacitor 34 may comprise a 1P140 type temperature sensitive capacitor having a glass dielectric. However, if the circuit design is such that the capacitors 30 and 32 have a positive temperature coefficient, then the capacitor 34 should have a negative temperature coefficient.

Referring again to Figure 5, the relative effectiveness $P_3$ of the capacitor 34 may be represented as follows:

$$P_3=1-[\sin \theta_3]$$

where $$\theta_3=\pi/2f_{(\text{mc.}/725)}$$

The capacitor 34 does not affect the frequency at 725 mc. because it is located at the null point of that frequency. However, it brings down the $K_1P_1+K_2P_2$ curve of Figure 5 at frequencies other than 725 mc. by an amount represented by the $K_3P_3$ curve 46. The dotted curve 47 $(K_1P_1+K_2P_2+K_3P_3)$ is the final result of the three point compensation. It will be noted that it does not depart appreciably from the ideal compensation at any of the frequencies over which the ultra high frequency oscillator is to be tuned.

Although the resonant transmission line described is a capacity end-loaded type, it will be understood that the invention is equally applicable to other types of tunable lines such as those using relatively movable elements for shorting the line at different distances from the end of the line. Furthermore, the invention is equally applicable to resonant transmission lines connected in other than oscillator circuits, such as in amplifier circuits by way of example.

Referring now to Figure 6, the physical configuration of an ultra high frequency television tuner of Figure 3 incorporating three-point temperature compensation in accordance with the invention includes a conductive chassis 60 with an oscillator tube 10' supported on the top or upper surface thereof. The tuner includes a double tuned signal selection circuit, not shown, for selecting any one of the 70 UHF television channels. The selected signal is heterodyned with a local oscillator signal which differs in frequency from the selected signal by an amount equal to the desired intermediate frequency. The oscillator is tuned by a resonant transmission line 20' having a pair of parallel conductors 21' and 22' which extend from an anode socket pin 61 and control grid socket pin 62 of the ultra high frequency oscillator tube 10' to a pair of stator assemblies 24' and 25' of the variable tuning capacitor 17. The stator assemblies each include several parallel plates which are adapted to mesh with the rotatable rotor plate assemblies 26' and 27' mounted on the conductive tuning shaft 28'. The shaft 28' extends to the exterior of the tuner housing to provide a means for simultaneously tuning the signal selection and oscillator circuits. The negative-temperature-coefficient compensating capacitors 30', 32' are connected between the conductors 21' and 22' at the oscillator tube pins 60 and 61, and at the junction of the conductors 20' and 21' and the stator plates 25' and 26' respectively.

The positive temperature coefficient capacitor 34' is connected between the conductors 21' and 22' at a point ⅞ of an inch from the junction of these conductors with the stator assembly including the stator plates 25' and 26'. As pointed out above, a voltage null point appears at this position for a frequency of 725 mc.

Referring to Figure 7, the frequency deviation in megacycles of the ultra high frequency tuner shown in Fig. 6 without the capacitors 30, 32 and 34 has been plotted against time in minutes, and is shown in the dashed line 29. It can be seen by casual observation that even after 30 minutes of warm-up time, the frequency deviation from the desired frequency which in the particular case is 700 mc., is as much as 350 kc. It has been found by experiment relating to the local oscillator stability for color television programs under standard conditions that a frequency deviation of plus or minus 50 kc. is quite acceptable and that of 100 kc. satisfies most viewers. It can be seen from the graph of Figure 7 that the conventional television turner does not come within the minimum operating limits of 100 kc. deviation until after 45 minutes of operation for an oscillator frequency of 700 mc. The solid lines 48, 49, 50 and 51 indicate similar frequency deviations with time for ultra high frequency tuners constructed in accordance with the invention at 550 mc., 700 mc., 850 mc. and 931 mc. respectively and it can be seen that for 700 mc., after a period of three or four minutes, in the examples considered, the oscillator frequency is stabilized within the acceptable limits of 100 kc., as compared with the conventional type of tuner heretofore used which takes much longer.

The ultra high frequency tuning circuit provided in accordance with the invention includes two or more temperature-sensitive reactances such as capacitors positioned selectively along a resonant transmission line to compensate for frequency deviations of the tuning circuit due to temperature changes. By proper selection and positioning of the compensating capacitors, the frequency of the tuning circuit is maintained within a relatively narrow frequency range after only a relatively short warm-up period.

What is claimed is:

1. A frequency compensation system for an ultra high frequency tuning circuit of the type including a tunable resonant transmission line as the frequency selective element thereof, comprising first and second temperature-sensitive reactance devices, said first temperature-sensitive reactance device connected across said resonant line at a position along the length thereof corresponding to a voltage minimum for tuning of said circuit to a first frequency, said second temperature-sensitive reactance device connected across said resonant line at a position along the length thereof corresponding to a voltage minimum for tuning of said circuit to a second frequency, said first and second temperature-sensitive reactance devices providing reactance variation with temperature changes tending therein to compensate said tuning circuit against deviations in frequency response due to temperature changes.

2. A frequency compensation system for a high frequency signal tuning circuit for reducing deviation in tuning from a desired operating frequency with changes in temperature, comprising a resonant transmission line for said tuning circuit, means for tuning said resonant transmission line over a range of high frequencies, a first temperature-sensitive capacitor connected across said resonant line near one end thereof and primarily effective to compensate for frequency deviations of said tuning circuit at one end of said tuning range, a second temperature-sensitive capacitor connected across said resonant line near the opposite end thereof and primarily effective to compensate for frequency deviations of said tuning circuit at the other end of said tuning range.

3. The combination with an ultra high frequency tuner of the type including a tunable resonant transmission line of frequency compensating means, comprising first and second temperature sensitive capacitors, means connecting said capacitors across said resonant line in predetermined spaced relation at different positions along the length thereof, and a third temperature sensitive capacitor having a temperature coefficient of opposite sense to that of said first and second capacitors connected across said resonant transmission line in predetermined spaced relation to and between said first and second capacitors.

4. A frequency compensating circuit for an ultra high frequency tuner to reduce deviations from a desired operating frequency caused by temperature variations, comprising a resonant transmission line for said tuner, said resonant transmission line comprising a pair of conductors disposed in spaced parallel relation, means for tuning said resonant line over a predetermined ultra high frequency range, first and second temperature sensitive capacitors having temperature coefficients for compensating the temperature vs. frequency deviation characteristic of said tuner connected between said parallel conductors adjacent the oposite ends thereof, and a third temperature sensitive capacitor having a temperature coefficient of opposite sense to that of the first and second capacitors, said third capacitor being connected between the parallel conductors of said resonant line at a position between the first and second capacitors.

5. In an ultra high frequency tuner, the combination comprising an oscillator stage, means for tuning said oscillator stage comprising a tunable resonant transmission line having a pair of conductors for connection at one end thereof with said oscillator stage and extending in parallel relation therefrom, capacitive means for tuning said resonant transmission line connected to the opposite end thereof, means providing first and second temperature sensitive capacitors, means connecting said first temperature sensitive capacitor between the parallel conductors of said resonant transmission line at the end thereof for connection with said oscillator stage to primarily compensate for frequency deviations due to temperature variations at the low frequency end of the tuning range of said oscillator stage, and means connecting the second temperature sensitive capacitor between the parallel conductors of said resonant transmission line at the end thereof connected to said capacitive means to primarily compensate for frequency deviations due to temperature variations at the high frequency end of the tuning range of said oscillator stage, said first and second capacitors having a temperature coefficient of a sense to provide compensation for frequency deviations of said tuner with temperature variations.

6. A frequency compensation system for a high frequency tuner to reduce deviations from a desired operating frequency with temperature variation, comprising the combination of a resonant transmission line for said tuner, and means providing first and a second temperature sensitive capacitor, said first capacitor being connected across said resonant transmission line at a voltage null point for a first frequency, said second capacitor being connected across said resonant transmission line at a voltage null point for a second frequency, and said capacitors having a temperature coefficient of a sense to compensate for frequency deviations of said tuner from a desired operating frequency with temperature changes.

7. A frequency compensation system for a high frequency tuner to reduce deviation from a desired operating frequency with temperature variations comprising the combination of, a resonant transmission line for said tuner including means for tuning said transmission line over a predetermined ultra high frequency range, a first temperature-sensitive capacitor connected across said resonant transmission line at a voltage null point for a frequency near the high frequency end of said range, said capacitor having a temperature coefficient of a sense to compensate primarily for deviations of said tuner frequency at the low frequency end of said range with temperature variations, a second temperature-sensitive capacitor connected across said resonant transmission line at a voltage null point for a frequency near the low frequency end of said range, said second capacitor having a temperature coefficient of a sense to compensate primarily for deviations in tuner frequency at the high frequency end of said range with temperature variations, and a third temperature-sensitive capacitor connected across said resonant transmission line at the voltage null point of the frequency at which the composite compensation effectiveness of said first and second capacitors is minimum, said third capacitor having a temperature coefficient of opposite sense to that of said first capacitor.

8. A frequency compensation system for a high frequency tuner to reduce deviation from a desired operating frequency with variations in temperature comprising in combination, a tunable oscillator stage, means for tuning said oscillator stage including a resonant transmission line having a pair of conductors each of which is connected at one end thereof with said oscillator stage and extend in parallel relation therefrom, first temperature-sensitive capacitor connected between the conductors of said resonant transmission line adjacent said oscillator stage, said first capacitor having a negative temperature coefficient to compensate primarily for deviations of said oscillator frequency at the low frequency end of said range, means providing a second temperature-sensitive capacitor connected between the parallel conductors of said resonant transmission line adjacent the other end thereof, said second capacitor having a negative temperature coefficient to compensate primarily for deviations in tuner frequency at the high frequency end of said range, and a third temperature-sensitive capacitor connected between the conductors of said resonant transmission line at a position intermediate the ends thereof, said third capacitor having a positive temperature coefficient to modify the compensation effects of said first and second capacitors at the low and high frequency ends of said tuning range respectively.

References Cited in the file of this patent

UNITED STATES PATENTS

| | | |
|---|---|---|
| 2,231,389 | Koffyberg | Feb. 11, 1941 |
| 2,740,889 | Eckert | Apr. 3, 1956 |

FOREIGN PATENTS

| | | |
|---|---|---|
| 389,346 | Great Britain | Mar. 16, 1933 |
| 436,056 | Great Britain | Oct. 3, 1935 |
| 621,145 | Great Britain | Apr. 5, 1949 |